United States Patent [19]

Choudhury

[11] Patent Number: 4,985,400

[45] Date of Patent: Jan. 15, 1991

[54] PROCESS FOR PRODUCING SUPERCONDUCTIVE CERAMICS BY ATOMIZATION OF ALLOY PRECURSER UNDER REACTIVE ATMOSPHERES OR POST ANNEALING UNDER OXYGEN

[75] Inventor: Alok Choudhury, Püttlingen, Fed. Rep. of Germany

[73] Assignee: Leybold Aktiengesellschaft, Hanau, Fed. Rep. of Germany

[21] Appl. No.: 404,185

[22] Filed: Sep. 7, 1989

[30] Foreign Application Priority Data

Jun. 28, 1989 [DE] Fed. Rep. of Germany ....... 3921127

[51] Int. Cl.$^5$ ...................... H01B 12/02; H01L 39/12
[52] U.S. Cl. .......................................... 505/1; 75/355; 505/733; 505/736; 428/930
[58] Field of Search ........................... 505/1, 733, 736; 75/0.5 C, 355

[56] References Cited

U.S. PATENT DOCUMENTS 4,778,517 10/1988 Kopatz et al. ..................... 65/0.5 C

FOREIGN PATENT DOCUMENTS 0265886 5/1988 European Pat. Off. ............... 505/1
0330196 8/1989 European Pat. Off. ............... 505/1
0124917 5/1989 Japan ................................... 505/733

OTHER PUBLICATIONS

Matsuzaki et al., Jap. Jour. Appl. Phys., 26 (Aug. 1987), L-1310.
Haldar et al., Appl. Phys. Letts., 51 (Aug. 1987), 538.

*Primary Examiner*—Upendra Roy
*Attorney, Agent, or Firm*—Felfe & Lynch

[57] ABSTRACT

The invention relates to a process for producing superconductive ceramics wherein, first, a liquid alloy melt is made of metals; this is carried out at a temperature at which the melt is chemically homogeneous. The melt is subsequently atomized with an inert gas or with oxygen. In the first case, a powder develops which is oxidized in a further step whereas in the second case the oxide powder is a direct result. By means of sintering, for example, the oxide powder can be pressed to superconductive bodies of any desired form.

11 Claims, No Drawings

PROCESS FOR PRODUCING SUPERCONDUCTIVE CERAMICS BY ATOMIZATION OF ALLOY PRECURSER UNDER REACTIVE ATMOSPHERES OR POST ANNEALING UNDER OXYGEN

The invention relates to a process for producing superconductive ceramics.

Until recently, only metals, intermetallic compounds, alloys and semiconductors were known as superconductive materials. Some of these metals, e.g. tungsten, have a specific electric resistance $\delta$ which falls, during cooling, below a critical temperature. Experimentally, this value cannot be distinguished from $\delta=0$. Hence, the critical or transitional temperature separates the superconductive condition from the normal-conductive condition. The transitional temperatures of the materials listed range between 0.012 K for tungsten and 23.2 K for $Nb_3Ge$. A sufficiently strong magnetic field eliminates the superconductivity again. The least required critical or threshold strength is dependent on the temperature.

It has been known for some time that ceramic materials can also be used when superconductivity is required. It is noteworthy in this case that more and more ceramic materials are found the critical temperatures of which are far away from the absolute temperature zero-point.

For example, superconductive compounds were mentioned for the Tl-Ba-Ca-Cu-O-system where the transitional temperature is between 80 K and 120 K: $Tl_2Ba_2CUO_{6+y}$, $TlBa_2CaCu_2O_{8+y}$, $Tl_2Ba_2Ca_2Cu_3O_{10+y}$, $TlBa_2Ca_3Cu_4O_{11}$ (Ihara, Sugise, et.al., "A new high $T_c TlBa_2Ca_3Cu_4O_{11}$ superconductor with $Tc > 120$ K," Nature, August 1988, p. 510, 511). $TlBa_2Ca_3Cu_4O_{11}$ is produced, for example, by heating up a powder mixture of $Tl_2O_3$, CaO, $BaO_2$, and $BaCu_3O_4$ with a nominal composition of $Tl_4Ba_2Ca_{n-1}Cu_nO_{2n+7}$ (n=1-6). Burning a mixture of $BaCO_3$ and CuO-powder for a period or 20 hours in air at a temperature of 1173 K results in the $BaCu_3O_4$-powders whereas CaO is obtained from $CaCO_3$ by burning for 10 hours at also 1173 K. Subsequently, the mixed powders of the initial materials are pressed and sintered to pellets having a diameter of 10 mm and a thickness of 1 mm. Following this, the pellets are heated up in an oven for a period of ten minutes with oxygen passed over; prior to this, the oven was heated up to 1163 K. Some of these pellets are subsequently cooled down in air to room temperature whereas other pellets are cooled down in the oven at a cooling rate of 100° C. per hour. Hence, powders must be produced, mixed, burnt and sintered.

This process is also frequently used for the production of other ceramic, superconductive materials, for example, in the production of $Y_1Ba_2Cu_3O_{6-7}$, wherein the initial materials yttrium oxide, barium carbonate, and copper oxide are ground, mixed, burnt, sintered and, subsequently, subject to a thermal treatment in an oxygen atmosphere.

The first production stage, the grinding, that is, must be so intensive that a particle size of less than 3 m is obtained. This is of particular significance in order to obtain a homogeneous material after the sintering. Due to the $Co_2$-development from the remaining carbonate, however, porosities occur during the sintering such that a density of the sintered body is obtained which corresponds only to 90% to the theoretically possible density. When using barium oxide instead of barium carbonate, it is possible to achieve a density of the sintered body of approximately 95% of the theoretical density; however, further problems occur during the thermal treatment in oxygen atmosphere: during the so-called charging of the sintered body the necessary oxygen diffusion is carried out very slowly due to the relatively heterogeneous structure of the sintered body. The consequence is that the external layer of the sintered body is superconductive, the core of the sintered body, however, does not remain superconductive. The larger the sintered body is in size, the harder it is to make it superconductive.

In order to avoid oxygen losses during the production of wires, it is known to add finely-ground powder as yttrium-barium-copper-oxide in a small tube made of aluminum or refined steel and 20 to 40 percent of silver or silver oxide which serve, in a way, as an oxygen store (Applied Physics Letters, Vol. 54, p. 766). First, the small tubes are rolled and then stretched to wires of 4 mm in diameter. The superconductive core has then a thickness of only 1.5 mm. Independently from the contents of silver and silver oxide, these wires become superconductive at a temperature of 86 K(= $-187°$ C.). For producing superconductive bodies other than wires, however, this process is only a little suitable.

A process is already known for producing a ceramic superconductor having a high transitional temperatures which facilitates the making of bodies of any desired form from porous metal oxides phases (DE-OS 37 11 975). First, the prealloy of the metal components of the substance system used is molten, then, the melt of the prealloy is used to form an amorphous or fine crystalline intermediate product using a rapid solidification technique. Subsequently, the rapidly solidified intermediate product was subject to an oxidization treatment with a simultaneous thermal treatment; during these procedures temperature ratios were observed at which a melting of the material is impossible. It is disadvantageous, that the solidification can occur in a temperature range of the melt in which the melt is chemically not homogeneous.

It is hence an object of the invention to provide a process which permits producing ceramic, superconductive materials in a simple and secure way.

This object is achieved in accordance with the features of claims 1, 2 or 3.

The particular advantage achieved with the invention is that the materials concerned are soluble among each other in the liquid state of matter such that the production of a homogeneous melt does not cause problems. An appropriate selection of the atomizing parameter permits obtaining a very fine-grained powder with an almost segregation-free or vitreous structure.

The following is a description of the production of two superconductive ceramics in accordance with the process of the invention.

EXAMPLE 1

A melt consisting of $Y_1Ba_2Cu_3$ with a weight of 500 g was produced in a ceramic-free cold-wall copper crucible with inductive heating. The melt was heated up to a temperature of 1500° C. At this temperature the melt is homogeneous. Subsequently, the melt was atomized with argon. By appropriately selecting the atomizing parameters 70% of very fine powder of $<1.5$ could be obtained. The powder exhibited a very homogeneous fine-dendrite primary structure. The distance of the dendrite arms was <1.5. Correspondingly, the distribution of the individual alloy elements was very uniform as it could be determined with an electron beam measuring probe. At 600° C., the powder was oxidized in an oxygen atmosphere. The oxidization temperature was selected such that the powder particles were not subject to any melting during the oxidization procedure. This oxidization converted the metal powder into a ceramic powder composed of $YBa_2Cu_3O_6$. From this ceramic powder several bodies were manufactured by means of the usual operational steps such as pressing, sintering, and charging with oxygen. These sintered bodies had the necessary composition $Yba_2CuO_{7.\delta}$ with $0.5 < \delta > 1.0$ which is required for superconductivity.

EXAMPLE 2

An alloy composed of $Tl_2Ba_2Ca_2Cu_3$ and a weight of 1000 g was produced and atomized according to the same method as represented in example 1. In an oxygen atmosphere at a higher temperature, the metal powder was converted into ceramic powder composed of $Tl_2Ba_2Ca_2Cu_3O_{10}$. After pressing the sample body was sintered in an oxygen current at a temperature of 920° C. The sintered body had the composition $Tl_2Ba_2Ca_2Cu_3O_{11-13}$ which is necessary for superconductivity.

The melt was produced in a melting furnace as it is known; preferably, the pressure in the furnace is >1 bar. This pressure is generated by an inert gas which is introduced into the furnace.

The oxidization process can be carried out by means of baking following the production of the powder; however, it is also possible to connect the oxidization process with the production of the powder by atomizing with oxygen rather than inert gas.

In order to obtain a very homogeneous melt to be atomized, it is advantageous to stir the melt prior to this procedure.

It must be noted, however, that within a certain temperature range there is no solubility in case two-component alloys are used. For example, yttrium and barium are not soluble between 1100 and 1300° C. whereas barium and copper, for example, are completely soluble. The melt to be atomized must hence be in a temperature range in which it is homogeneous.

With the oxide powder produced by atomizing it is possible to press superconductive bodies of any desired form. It is also possible to apply the oxide powder onto strip conductors which are made of certain materials. In case of strip conductors, the oxidization step can also be carried out subsequently by first applying the homogeneous metal powder itself onto suitable carrier materials in strip conductors and, subsequently, oxidizing so as to obtain the desired oxide composition.

An additional possibility is to first press the metal powder in any desired form, to sinter it and, subsequently, to convert it into superconductive ceramic bodies by means of oxidization.

Atomizing aggregates which can be used for atomizing the alloy melts are described, for example, in the book by E. F. Bradley "Superalloys—A Technical Guide", 1988, chapter 10, Powder Metallurgy Processing, pp. 143–161, published by ASM-International, Metals Park.

The German patent application P 39 10 777.9 describes a ceramicfree furnace in which the alloy is molten.

I claim:

1. Process for producing superconductive ceramics comprising:
   melting a prealloy in the desired concentration ratio from the metal components of the substance system used and forming an intermediate product from the alloy melt by applying a rapid solidification technique, comprising:
   a. bringing the melt to a temperature at which it is chemically homogeneous;
   b. atomizing the melt brought to this temperature to a powder by means of inert gas;
   c. baking the powder under oxygen atmosphere so as to produce oxide powder.

2. Process for producing superconductive ceramics comprising:
   melting a prealloy from the metal components of the substance system used in a desired concentration ratio and forming from this intermediate product a melt by applying a rapid solidification technique, comprising:
   a. bring the melt to a temperature at which it is chemically homogeneous;
   b. utilizing oxygen as an atomizing gas for atomizing the melt brought to this temperature so as to produce oxide powder.

3. Process in accordance with claim 1, in which the liquid alloy melt contains, on the one hand, the metal $Y_1Ba_2Cu_3$ and, on the other hand, the metal $Tl_2Ba_2Ca_2Cu_3$.

4. Process in accordance with claim 1, which comprises stirring the melt in order to homogenize the alloy.

5. Process in accordance with claim 1, which comprises producing the melt in a furnace at a furnace pressure of >1 bar.

6. Process in accordance with claim 1, which comprises pressing the oxide powder to superconductive bodies and sintering.

7. Process in accordance with claim 1, which comprises applying the oxide powder onto strip conductors.

8. Process in accordance with claim 1, which comprises first pressing the metal powder in any desired form, sintering and, subsequently, oxidizing for converting into superconductive ceramic bodies.

9. Process in accordance with claim 1, which comprises melting the alloy melt in a ceramic-free furnace.

10. Process in accordance with claim 5, which comprises producing an inert gas atmosphere in the furnace.

11. Process in accordance with claim 9, in which the ceramic-free furnace is a cold-wall copper induction furnace.

* * * * *